United States Patent [19]
McKown et al.

[11] Patent Number: 5,247,470
[45] Date of Patent: Sep. 21, 1993

[54] METHOD AND APPARATUS FOR ESTIMATING SIGNAL COMPONENTS OF A FILTER OUTPUT

[75] Inventors: John W. McKown; Russell C. McKown, both of Dallas; Thomas W. Summers, Richardson, all of Tex.

[73] Assignee: E-Systems, Inc., Dallas, Tex.

[21] Appl. No.: 79,008

[22] Filed: Jul. 29, 1987

[51] Int. Cl.$^5$ .......................................... G06F 15/31
[52] U.S. Cl. ........................ 364/724.11; 364/724.19
[58] Field of Search ............ 364/724, 724.16, 724.19, 364/724.11; 333/166; 375/11, 13–14

[56] References Cited

U.S. PATENT DOCUMENTS

| | | | |
|---|---|---|---|
| 3,409,838 | 10/1965 | McLeod, Jr. | 329/137 |
| 3,684,969 | 8/1972 | Jensen | 329/104 |
| 3,729,684 | 4/1973 | Shuda | 329/104 |
| 3,746,794 | 7/1973 | Stifle et al. | 379/89 |
| 3,746,997 | 7/1973 | Willett et al. | 325/349 |
| 3,938,052 | 2/1976 | Glasson et al. | 329/104 |
| 3,956,623 | 5/1976 | Clark et al. | 364/729 |
| 4,038,536 | 7/1977 | Feintuch | 364/724 |
| 4,052,559 | 10/1977 | Paul et al. | 333/166 |
| 4,112,497 | 9/1978 | Layland et al. | 364/728 |
| 4,177,430 | 12/1979 | Paul | 325/475 |
| 4,246,653 | 1/1981 | Malm | 375/82 |
| 4,246,654 | 1/1981 | Malm | 375/82 |
| 4,290,140 | 9/1981 | Malm | 375/46 |
| 4,322,851 | 3/1982 | Vance | 375/88 |
| 4,355,368 | 10/1982 | Zeidler et al. | 364/724 X |
| 4,649,505 | 3/1987 | Zinser, Jr. et al. | 364/724 X |

OTHER PUBLICATIONS

Bershad et al, "*A Normalized Frequency Domain LMS Adaptive Algorithm*", IEEE Trans. on Acoustics, Speech and Signal Processing, vol. ASSP-34, No. 3, Jun. 1986, pp. 452–461.

Dentino et al, "*Adaptive Filtering in the Frequency Domain*", Proc. of the IEEE, vol. 66, No. 12, Dec. 1978, pp. 1658–1659.

Ahuja et al, "*A Sampled Analog MOS LSI Adaptive Filter*", IEEE Trans. on Communications, vol. COM-27, No. 2, Feb. 1979, pp. 406–412.

Thompson, "*A Constrained Recursive Adaptive Filter for . . .*" Conference: Conference Record of the Twelfth Asilomar Conf. on Circuits, Syst. & Comp. Pacific Grove, Calif., U.S.A. (Nov. 6–8, 1978).

Osborne, "Coherent and Noncoherent Detection of CPFSK," Aug. 1974, *IEEE Transactions on Communications*, pp. 1023–1036.

Widrow, "Adaptive Noise Cancelling: Principles and Applications," *Proceedings of the IEEE*, Dec. 1975, pp. 1692–1716.

Griffiths, "A Simple Adaptive Algorithm for Real-Time Processing in Antenna Arrays," . . . Proceedings of the IEEE, vol. 57, No. 10, Oct. 1969, pp. 1696–1704.

Schonhaff, "Symbol Error Probabilities for M-ory CPFSK: Coherent and noncoherent Detection," IEEE Transactions on Communications, Jun. 1976, pp. 644–645, 650.

Pawula et al., "Simulations of Convolutional Coding-/Viterbi Decoding with Noncoherent CPFSK," IEEE Transactions on Communications, vol. COM-29, No. 10, Oct. 1981, pp. 1522–1526.

Whalen, "Detection of Signals in Noise," Academic Press (1971), pp. 176–177.

Clark, "A Unified Approach to Time-and Frequency-Domain Realization of FIR Adaptive Digital Filters," IEEE Transactions on Acoustics, speech and signal processing, vol. ASSP-31, No. 5, Oct., 1983, pp. 1079–1083.

*Primary Examiner*—Tan V. Mai
*Attorney, Agent, or Firm*—Harold E. Meier

[57] ABSTRACT

An adaptive matched filter is described as a replacement for a signal replica filter of a maximum likelihood (ML) demodulator, the filter normally receiving an input data vector having signal and noise components. A symbol-justified input data vector is produced from the input data vector. This vector is then used to generate a weight vector. In a time-domain embodiment, the symbol-justified data vector is multiplied by the weight vector on a symbol-by-symbol basis to estimate the signal components of the output of a filter. In a frequency-domain implementation, multiplication is carried out on a symbol block-by-symbol block basis.

32 Claims, 3 Drawing Sheets

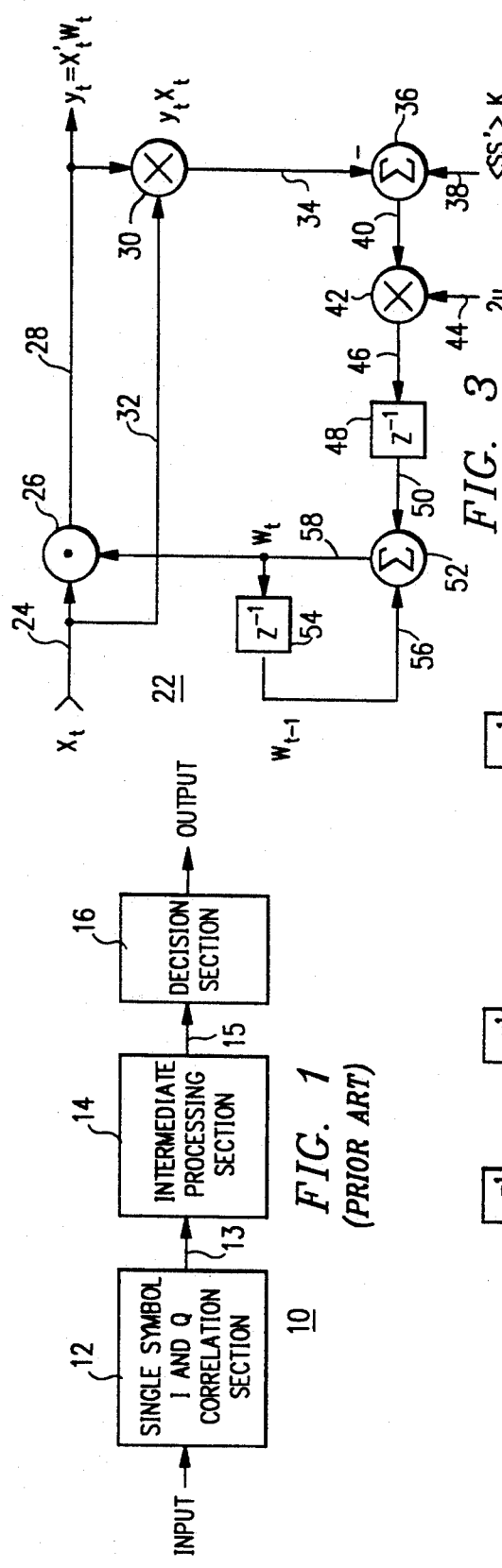
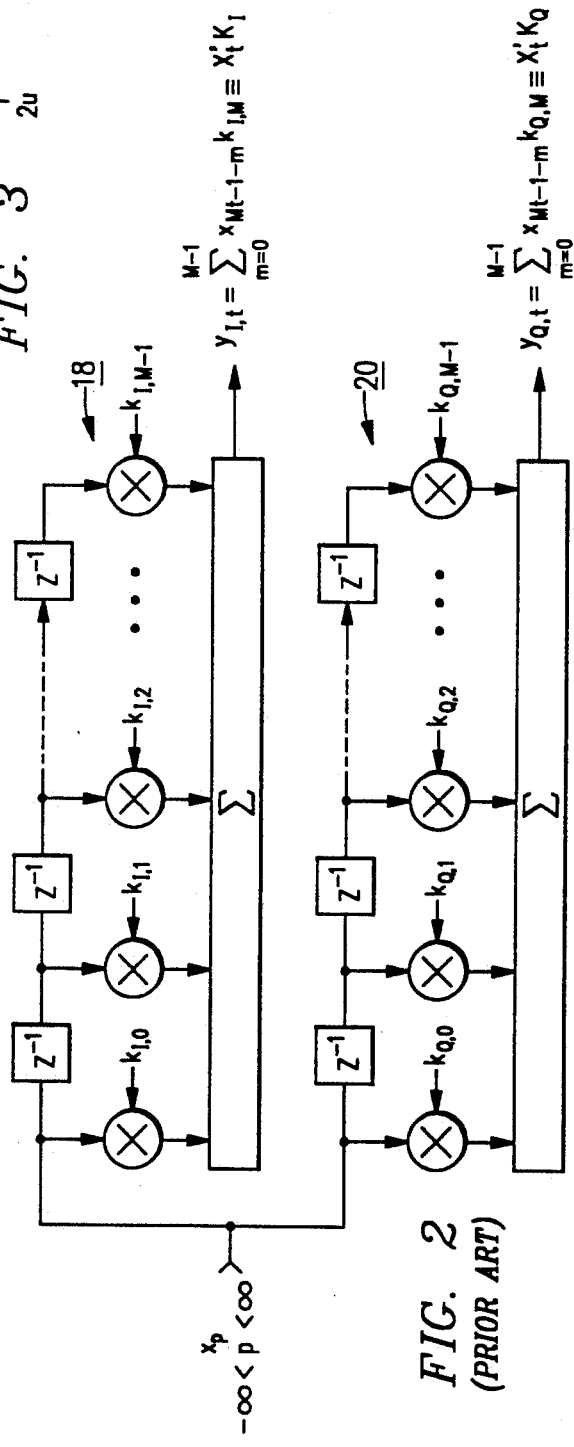

METHOD AND APPARATUS FOR ESTIMATING SIGNAL COMPONENTS OF A FILTER OUTPUT

TECHNICAL FIELD

This invention relates to signal processing and particularly to a method and apparatus for estimating signal components of a signal replica filter output used in a maximum likelihood (ML) demodulator.

BACKGROUND OF THE INVENTION

PCM demodulators form decisions on the identity of transmitted symbols using time-invariant correlation filters. Such filters arise naturally (as "matched" filters) in such demodulators when the noise in the communications channel is Gaussian and white (WGN), signal carrier phase is unknown (non-coherent signaling) and a so-called "maximum likelihood" (ML) rule is used to form symbol decisions. ML demodulators are also used in coherent signaling where it is Possible to formulate such demodulators in terms of fixed-coefficient filters.

Practical demodulators can be derived from the maximum likelihood rule when the noise in the channel is Gaussian and white. For example, it is known that a matched filter maximizes signal-to-noise ratio and becomes a "signal replica" filter under WGN. Demodulators which incorporate such "signal replica" matched filters are herein called "ML/WGN demodulators" and are often used in the prior art to demodulate PCM signals.

ML/WGN demodulators, however, do not function efficiently when the environment includes strong interference with unknown spectra and statistics. In undefined noise conditions the matched filter is usually unknown and therefore demodulation using the replica filter produces results which are less than satisfactory. One attempt to solve this problem involves "prewhitening" the non-white noise prior to detection in the filter. This approach is disadvantageous because the prewhitening filter requires knowledge of the isolated noise statistics and because the filter introduces intersymbol interference (which can only be accounted for in subsequent detection or demodulation steps). In addition, the prewhitening filter often requires many coefficients and operates at the incoming sample frequency. Accordingly, prewhitening can thus be implemented only in an approximate sense and is costly and unreliable. Other attempts to provide predemodulation interference cancellation, such as adaptive least mean squared error (LMSE) estimation of individual signal samples, using the same estimator for all samples, also produce unacceptably high symbol error rates during detection of PCM.

There is therefore a need to provide an improved matched filter which is effective in undefined noise and which does not require prewhitening and other forms of predemodulation interference cancellation. The resulting demodulator would then be advantageous for many types of bauded signals because predemodulation interference cancellation is a general practice in strong interference and all known techniques are subject to various limitations.

BRIEF SUMMARY OF THE INVENTION

It is known that a maximum likelihood (ML) demodulator can be formulated in terms of fixed-coefficient, signal-replica filters for many bauded, information-bearing signals in WGN. According to the present invention, each such signal replica filter is replaced with a matched filter to form least mean squared error (LMSE) estimates of the signal components of signal-synchronous outputs of the original signal replica filter. In the preferred embodiment, each such matched filter of the present invention is adaptive with respect to the input signal and employs either a time-domain or frequency-domain algorithm to form the LMSE estimates. Both the time-domain and frequency-domain algorithms exploit synchronization with the bauded signal and require that the sampling frequency be an integer multiple of the symbol frequency (such that an integer number of samples-per-symbol are produced). Signal-synchronous sampling according to the invention facilitates high performance demodulation even in substantial interference because such sampling respects the time dependence of the signal ensemble average.

According to the invention, a conventional signal replica filter used in a prior art ML/WGN demodulator is replaced by an adaptive matched filter, the outputs of which converge to an approximation of the signal components of the outputs of the signal replica filter. In the time-domain embodiment, the signal components of the signal replica filter are estimated by multiplying a derived weight vector by a symbol-justified input data vector on a symbol-by-symbol basis. In the frequency-domain implementation, the multiplication of the weight and symbol-justified input data vectors is carried out on a symbol block-by-symbol block basis. These algorithms are advantageous because they do not require knowledge of the autocorrelation of the signal-plus-noise. To the contrary, the matched filter requires only knowledge of signal autocorrelation properties. This filter is thus obtainable, a priori, from knowledge of the basic signal modulation scheme.

BRIEF DESCRIPTION OF THE DRAWINGS

For a more complete understanding of the present invention and the advantages thereof, reference is now made to the following Description taken in conjunction with the accompanying Drawings in which:

FIG. 1 is a block diagram of a large class of prior art ML/WGN demodulators;

FIG. 2 is a schematic diagram of a pair of digital correlation signal replica filters commonly implemented in the correlation section of FIG. 1;

FIG. 3 is a schematic diagram of a time-domain version of the adaptive matched filter of the present invention;

DETAILED DESCRIPTION

Figure 4:
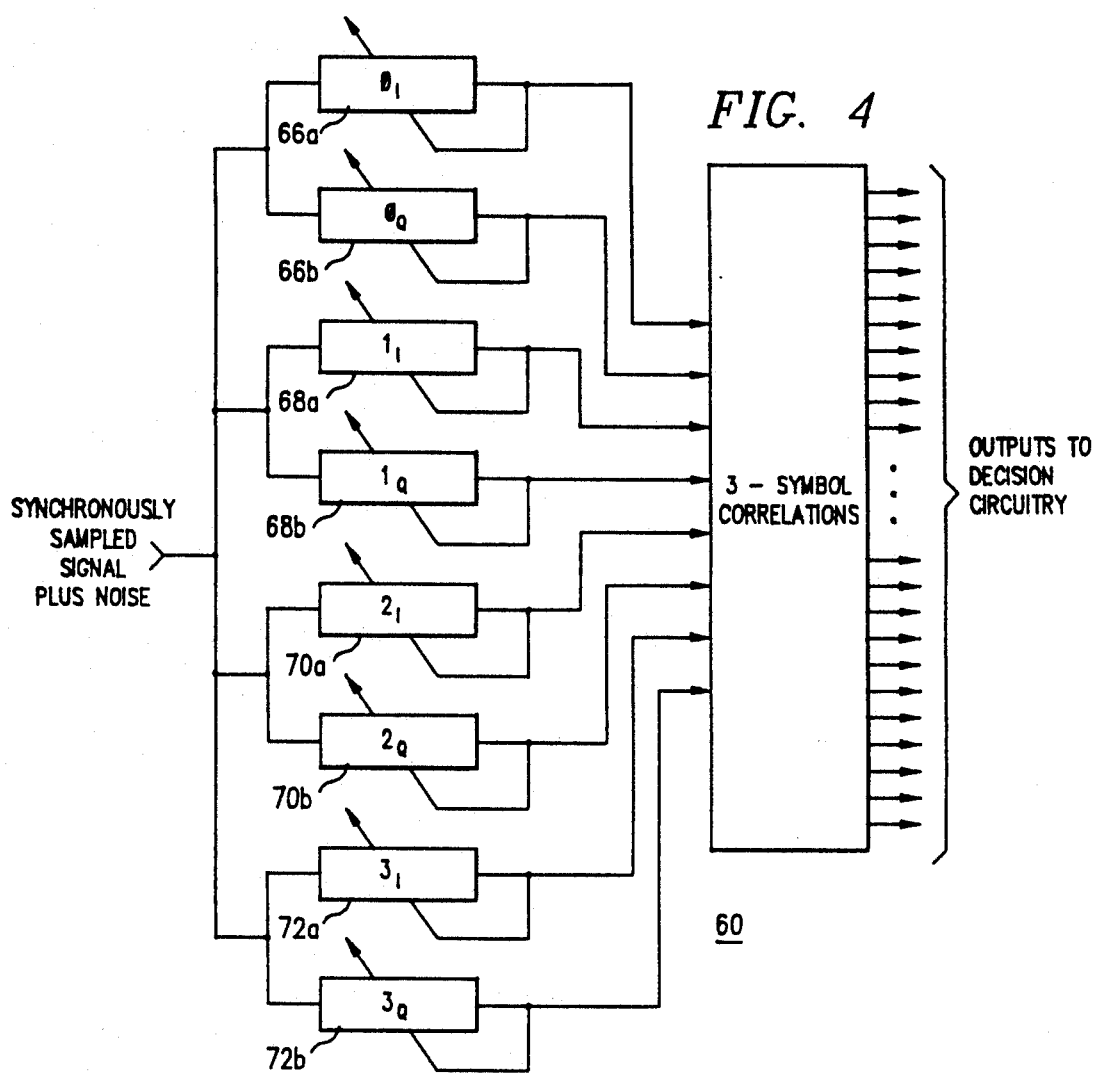
FIG. 4 is a block diagram of an improved ML/WGN demodulator for quaternary continuous phase frequency shift keyed (QCPFSK) signals incorporating the adaptive matched filter of FIG. 3.

Referring now to the drawings wherein like reference characters designate like or similar parts throughout the several views, FIG. 1 is a general block diagram for a large class of prior art ML/WGN coherent and non-coherent demodulators for PCM signals in WGN. As seen in FIG. 1, each such prior art ML/WGN demodulator 10 generally includes three sections, a single symbol I and Q correlation section 12, an intermediate processing section 14, and a decision section 16. The correlation section 12 includes fixed-coefficient or time-invariant "signal replica" correlation filters. The ML/WGN demodulator uses a so-called "maximum likelihood" (ML) rule to form symbol decisions. The maximum likelihood rule is stated as follows:

> Given an observation vector $X = S + N$ where S is the transmitted symbol and is one of a set $\{S(k) | 0 \leq k \leq K-1\}$ and N is a vector of noise samples, decide $S = S(k)$ such that $P(X|S(k))$, the probability density for the occurrence of X given the occurrence of $S(k)$, is maximized over the index k.

The correlation section 12 of the ML/WGN demodulator 10 of FIG. 1 is derived from the ML rule stated above when the noise vector N is Gaussian and white (WGN). The outputs of the correlation section 12 are coupled via line 13 to the intermediate processing section 14, which section may include time delay and phase compensation networks. The signals processed by the intermediate processing section 14 are thereafter provided to the decision section 16 via line 15 to determine the identity of the transmitted symbols.

Referring now to FIG. 2, a schematic diagram is shown of one pair of quadrature signal replica filters 18 and 20 for use in the correlation section 12 of FIG. 1. Generally, filters 18 and 20 correlate a sample sequence "$x_p$" received as data input vectors $X_t$, having signal ($S_t$) and noise ($N_t$) components, with each of the possible transmitted symbols using I and Q processing for non-coherent signaling. The outputs $y_{I,t}$ and $y_{Q,t}$ of the signal replica filters 18 and 20 are the dot products of the data vector $X_t$ with the coefficient vectors $K_I$ and $K_Q$, respectively.

When coefficient vectors $K_I$ and $K_Q$ are taken to be symbol replicas in quadrature, the signal replica filters 18 and 20 are suitable as one of the I and Q correlator pairs in the single-symbol correlation section 12 of FIG. 1. When the sample frequency is above the Nyquist frequency for the incoming process, the signal replica filters 18 and 20 are well known to produce outputs $y_{I,t}$ and $y_{Q,t}$ which accurately approximate correlators called for in the continuous waveform ML/WGN demodulator of FIG. 1.

Correlators of the type shown in FIG. 2, however, are operated synchronously in prior art ML/WGN demodulators in that only one filter output is collected per symbol. This filter output is typically produced at the time when the symbol of interest is justified within the correlation filter. If the vectors $X_t$, $K_I$ and $K_Q$ are all extended in length beyond one symbol, the filter outputs $y_{I,t}$ and $y_{Q,t}$ remain unchanged, provided that all new components added to the "K" coefficient vectors are zero. According to the invention, this fact is exploited to perform signal synchronous sampling of the input data vector. Specifically, it is known that if the sample frequency is an integral multiple of the symbol frequency, then there are an integer number of samples-per-symbol. When knowledge of the symbol transition times (signal synchrony) is also available, the input data vector $X_t$ may be chosen to include an integral number of symbols. The vectors $X_t$, $K_I$ and $K_Q$ may thus be taken to have dimension "MN" where N is a integer number of symbols and M is the integer number of samples-per-symbol. The symbol index "t," which identifies the data vector $X_t$, is the index of a symbol within $X_t$ which is to be demodulated; typically, this symbol is the center one (odd N) and thus $X_t$ includes symbols on either side of the $t^{th}$ symbol. According to the invention, the vectors $K_I$ and $K_Q$ are made everywhere zero except in positions corresponding to this central symbol. This convention is adhered to in the following derivation.

With the time origin chosen such that the $t^{th}$ symbol is the samples "$x_p$," where $tM \leq p \leq (t+1)M - 1$, the data vector $X_t$ is therefore:

$$X_t = [x_{(t+(N+1)/2)M-1} \; x_{(t+(N+1)/2)M-2} \cdots x_{(t-(N-1)/2)M}] \quad (1)$$

When the input data vector $X_t$ is the sum of a signal vector $S_t$ and an arbitrary noise vector $N_t$, the signal components of the outputs of either of the signal replica filters of FIG. 2 are represented by the scalar:

$$d_t = S_t' K \quad (2)$$

If weight vector "W" indicates the coefficients of a filter which act on $X_t$ to produce a scalar output "$y_t$" (which is an estimate of $d_t$), the mean squared error "e" of this estimate is:

$$\begin{aligned} <e^2> &= <(d-y)^2> = <d^2> + <y^2> - 2<dy> \\ &= <d^2> + W'<XX'>W - 2K'<SX'>W. \end{aligned} \quad (3)$$

Because noise is not correlated with the signal, equation (3) reduces to:

$$<e^2> = <d^2> + W'<XX'>W - 2W'<SS'>K \quad (4)$$

Equation (4) is of a form well known to have no non-global minima as weight vector "W" is varied. The value of vector "W" which produces the minimum mean squared error is therefore obtained by zeroing the gradient of the mean squared error function of equation (3) with respect to the weight vector:

$$\Phi = \text{grad}_w <e^2> = 2<XX'>W - 2<SS'>K, \text{ or} \quad (5)$$

$$W = <XX'>^{-1}<SS'>K = [<NN'> + <SS'>]^{-1}<SS'>K \quad (6)$$

Equation (6) defines a signal synchronous "Wiener" filter which acts on the incoming data $X_t$ to produce a least mean squared error (LMSE) estimate of the $t^{th}$ signal component of the output of the correlator specified by the signal replica filter vector "K". If the sample rate is an integral multiple of the constant symbol transmission rate, if the length of the input data vector is chosen to include an integral number of symbols, and if the derived matched filter is operated in justification with the symbols (so that no partial symbols are included at the ends), then the ensemble average matrix $<SS'>$ of equation (6) is a block Toeplitz matrix. Assuming a white message (with negligible correlations between message values) and a stationary noise process, the elements of the ensemble average matrix $<SS'>$ are time invariant. This invariance is necessary if an adaptation process is to converge on the weight vector "W." Significantly, this result cannot be achieved using prior art LMSE estimation processes involving PCM signals formulated on a sample-by-sample basis. Stated differently, use of a synchronously sampled and symbol-justified input data vector according to the invention facilitates adaptive approximation of the Wiener filter of equation (6).

The so-called "Griffiths" iteration is one adaptive process which is used according to the preferred embodiment to approximate the Wiener filter of equation (6). This iteration takes the form of:

$$W_{t+1} = W_t + 2u[<SS'>K - y_t X_t]. \qquad (7)$$

The variable "u" in equation (7) represents a scalar constant or function which controls the rate of adaptation of the iteration. The Griffiths iteration is well known to converge to an excellent approximation to the Wiener filter of equation (6) when u is sufficiently small and the input process is sufficiently close to stationary. Such stationarity is achieved according to the invention by iterating at the symbol rate and sampling at an integral multiple of the symbol rate.

Equation (7) above involves only quantities which are calculated at each iteration ($y_t$), derived from the input data vector ($X_t$) or known a priori ($<SS'>K$). This equation, therefore, is executable without matrix inversion or knowledge of the autocorrelation of the input signal vector "X". Equation (7) defines a "time-domain" version of the adaptive matched filter of the present invention. This adaptive matched filter estimates the signal-only outputs of the signal replica filter "K" which it replaces in a ML/WGN demodulator. The described matched filter differs from the prior art in that it is executed in synchrony and register with the signal vector "S" so that the Wiener solution to which it converges (equation (7)) is time-invariant given the assumption of white message and stationary noise. These assumptions are less restrictive and therefore more widely useful than the prior art assumption that both the noise and the signal are stationary on a sample-by-sample basis; the latter assumption does not in fact lead to convergence to a time-invariant Wiener solution with PCM signals. Use of the improved cyclostationary signal model in the adaptive matched filter of the present invention provides greater estimation accuracy and therefore lower symbol error rates.

According to the present invention, each of the predetermined maximum likelihood (ML) filters normally used in the ML/WGN demodulator 10 of FIG. 1 is replaced by an adaptive matched filter which estimates the signal-only components of the original signal replica filter which the matched filter replaces. When the adaptive matched filter is substituted for the signal replica filter, the effects of interference are cancelled to a degree dependent of the accuracy of the estimation.

Referring to FIG. 3, a schematic diagram is shown of the preferred time-domain implementation of the adaptive matched filter 22 of the present invention. Filter 22 receives the synchronously sampled and symbol-justified input data vector $X_t$ on line 24. This vector is supplied as one input of a dot product operator 26, the other input thereto being a derived weight vector $W_t$ to be described. The dot product operator 26 generates the scalar filter output $y_t$ on line 28. As noted above, output $y_t$ represents the least mean squared error (LMSE) estimates of the signal components ($d_t$) of a conventional signal replica filter (vector "K") which filter 22 replaces in the ML/WGN demodulator 10 of FIG. 1. Filter 22 includes a first scalar-vector multiplication operator 30 which has a first input for receiving the filter output and a second input for receiving the symbol-justified input data vector $X_t$ via line 32. Operator 30 generates an output vector "$y_t X_t$" which is applied via line 34 to one input of a first vector addition operator 36, the other input thereto for receiving the righthand side vector "$<SS'>K$" of equation (7) via line 38. Operator 36 subtracts the vectors applied thereto and generates an output vector "$<SS'>K - y_t X_t$" on line 40. This output vector is then supplied via line 40 to one input of a second scalar-vector multiplication operator 42, the other input for receiving an adaptation rate constant "$2u$" via line 44. Operator 42 generates an output on line 46 which is applied to a first unit symbol delay block 48. Delay block 48 generates an output on line 50 which is applied to a second vector addition operator 52. Operator 52 receives a delayed version of the weight vector ($W_{t-1}$), generated by a second unit symbol delay block 54, via line 56 and generates the weight vector $W_t$ on line 58. As noted above, the weight vector $W_t$ is then supplied to the dot product operator 26 to form the signal components of the signal replica filter to be replaced by the filter 22.

Filter 22 generates symbol-synchronous estimates "$y_t$," which are an estimate of how much of the output of a conventional signal replica filter "K" is due to signal only. If these estimates are accurate (i.e., if the noise is properly accounted for), the output of the filter 22 represents the signal itself.

Figure 5:
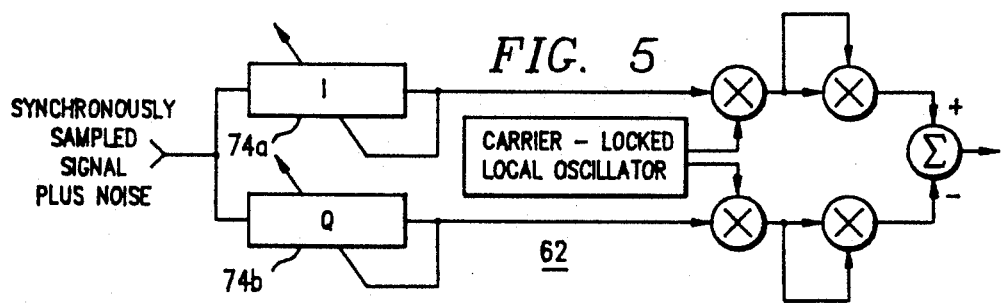
FIG. 5 is a block diagram of an improved ML/WGN demodulator for binary phase shift keyed (BPSK) signals incorporating the adaptive matched filter of FIG. 3.

Referring now to FIGS. 4 and 5, block diagrams are shown for demodulators 60 and 62 for quaternary continuous phase frequency shift keyed (QCPFSK) and antipodal, binary phase shift keyed (BPSK) signals, respectively. In FIG. 4, the demodulator 60 is formed by providing signal-synchronous sampling of the input data signal as previously docketed and replacing the signal replica filters 66a-b, 68a-b, 70a-b and 72a-b normally used in the demodulator with the matched filter of equation (7). A similar result is achieved in FIG. 5 by providing a synchronously sampled and symbol-justified input signal and by replacing each conventional signal replica filter 74a-b with the adaptive matched filter 22 of FIG. 3 (or the frequency-domain implementation thereof to be described below).

Figure 6:
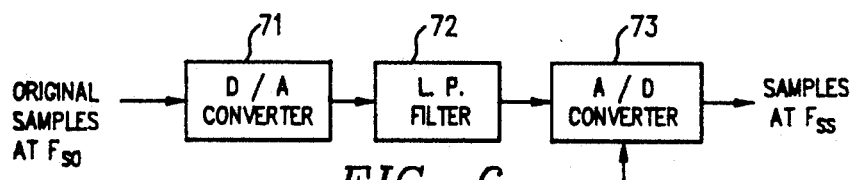
FIG. 6 is a schematic diagram of a circuit used to generate a synchronously sampled and symbol-justified input data vector according to the invention.

Referring now to FIG. 6, a block diagram is shown of a circuit for generating the synchronously sampled and symbol-justified input signal for use by the matched filter defined by equation (7). Assuming the nominal pulse repetition interval (PRI) for the received signal is known, possibly by standard measuring techniques, and also assuming that the received signal has been appropriately limited to "BW megahertz", then this received signal may be sampled, without loss of information at $F_{s\,o} = 2(BW)$. The received signal at the sampled frequency ($F_{s o}$) is input to a digital-to-analog converter 71, assuming a digital signal, and then applied to a low pass filter 73. The original samples at the sample frequency $F_{s o}$ are applied from the low pass filter 73 to an analog-to-digital converter 75 that is clocked at a synchronous sampling frequency $F_{s\,s}$.

The number of samples per baud provided by this synchronous sampling frequency is derived from the expression:

$$M = \text{round}\,(PRI\,\text{sec}\cdot F_{s\,o}\text{sec}^{-1}),$$

where M is an integer number of samples given in accordance with the expression:

$$F_{s\,s} = M/PRI.$$

Adjusting the synchronous sampling frequency $F_{s\,s}$ in accordance with the above expression generates samples at the output of the analog-to-digital converter 75 for input to the demodulators 60 and 62 of FIGS. 4 and 5.

The estimation accuracy of the time-domain filter 22 of FIG. 3 generally improves as the filter length increases. In severe interference, however, the filter length may be such that frequency-domain processing is desirable to achieve computational efficiency. The baud-synchronous operation called for in equation (7) is not a proper correlation with unit shifts between outputs. In order to define the frequency-domain processing, three time scales need to be distinguished: sample, symbol and symbol block. An ordinary time-domain single channel transversal filter operates at the sample rate, i.e., one scalar output is generated for each scalar input and processing proceeds in "blocks" one sample in length. If a symbol is considered a vector of samples, a synchronous filter produces one scalar output per input vector. The frequency domain filter to be described is designed to process long blocks of such symbol vectors, each vector including a plurality of samples. Such block processing facilitates the use of "fast" convolution and correlation, e.g. Fast Fourier Transform (FFT) algorithms, which techniques increase computational efficiency.

The frequency domain filter of the present invention is functionally equivalent to the time-domain implementation of FIG. 3 except that the former minimizes the sum of the mean squared estimation errors over a block of symbols whereas the latter minimizes the mean squared error for individual symbols. The use of the frequency-domain matched filter in the demodulators of FIGS. 1 and 4-5 is advantageous because it involves fewer calculations as the filter length is increased and because processing of the input data is accomplished in blocks.

Figure 7:
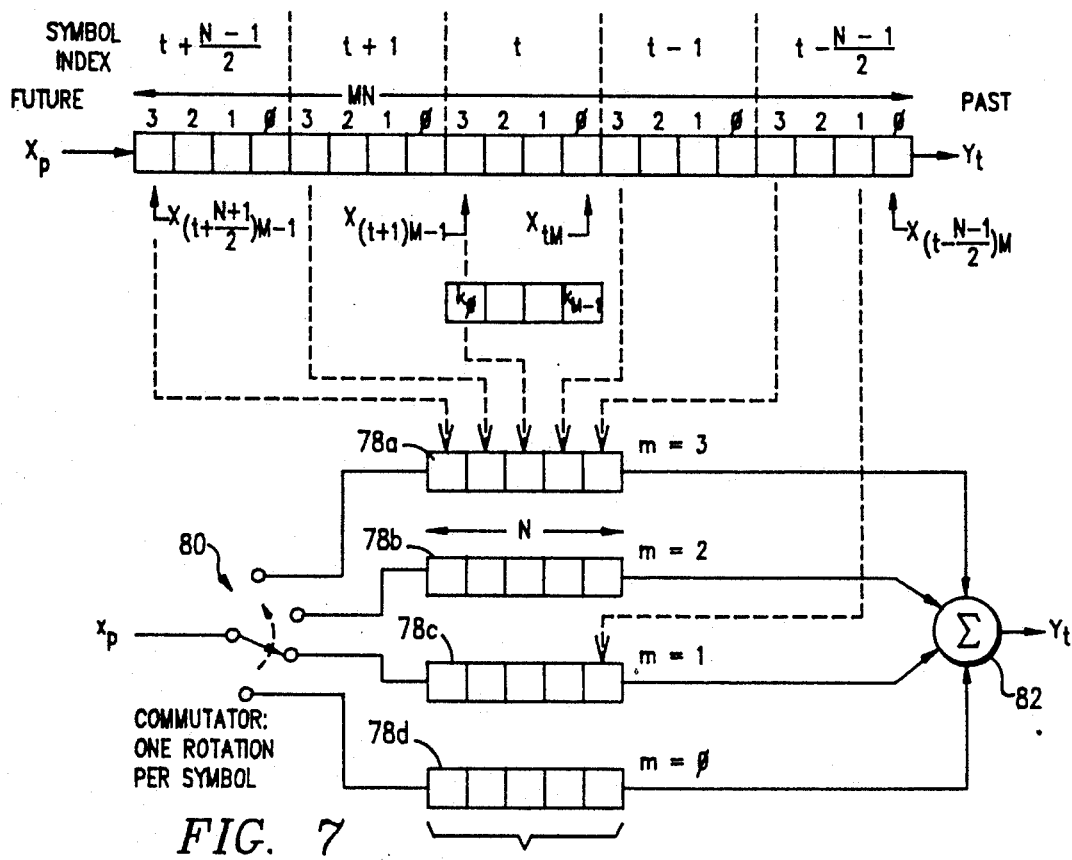
FIG. 7 is a symbolic diagram of a partitioning operation which is a necessary conceptual step to derive the block processing of the input data vector according to the invention.

Referring now to FIG. 7, a symbolic diagram is shown of a partitioning operation which illustrates symbol block processing of the input data vector. Such processing facilitates implementation of a frequency-domain filter according to the present invention. Specifically, FIG. 7 shows subfilters 78a–d, each with "N" taps. The variable "$x_t^m$" is the $m^{th}$ sample of the $t^{th}$ symbol and is used to define the $t^{th}$ data vector for the $m^{th}$ subfilter as follows:

$$X_t^m = [x_{t+\frac{N-1}{2}}^m,\, x_{t+\frac{N-1}{2}-1}^m,\, \ldots,\, x_t^m,\, \ldots,\, x_{t-\frac{N-1}{2}}^m],$$

where $$x_t^m \equiv x_{Mt+m}.$$

The subfilters 78a–d are shown symbolically in FIG. 7 as rows of boxes, each box representing a data register, with input samples entering via a commutator 80. Commutator 80 rotates once per symbol and thus routes the input data samples to the subfilters 78a–d, the outputs of which are summed by operator 82 to produce the estimates "$y_t$":

$$y_t = \sum_{P=0}^{NM-1} w_p x_{(t+\frac{N+1}{2})M-1-p}$$

FIG. 7 thus depicts the data registers of a synchronous transversal filter. Data flow through these registers occurs in jumps of size "M" positions and each of the "M" species of data samples appears against only "N" out of the total of "NM" weights. Because the subfilters process with unit data translations, fast convolution techniques may be applied efficiently to them as required to implement the frequency-domain filter.

To derive an adaptive algorithm for the partitioned transversal filter structure of FIG. 7, the following assumptions are made:

(a) The signal is bauded and preferably has sharp symbol boundaries;
(b) The input is synchronously sampled as described above, the "M" samples per symbol are at known times within the symbols;
(c) The message is white, i.e. the bits are independent random variables which individually assume all permitted values with equal probability; and
(d) The adaptive filter operates to form estimates of the signal components of the outputs of a (given) synchronously operating "kernel" filter having "M" taps The following indices are then defined:
$0 \leq m \leq M-1$: where "M" represents the number of samples-per-symbol;
$-\infty \leq t \leq \infty$: where "t" indexes symbols:
$-\infty \leq j \leq \infty$: where "j" indexes processing blocks of length "L" symbols; and
$-\infty \leq p \leq \infty$: where "p" indexes the sample;
$S_p$: represents the "$p^{th}$" signal sample;
$r_p$: represents the "$p^{th}$" environment sample;
$x_p = S_p + r_p$: represents the "$p^{th}$" input sample for the entire filter;
$x_t^m = x_{m+tM}$: represents the $t^{th}$ input sample for the $m^{th}$ subfilter;
$k_m$: represents the $m^{th}$ coefficient of a kernel filter;
$d_t$: represents the $t^{th}$ desired output of the entire filter;
$y_t$: represents the $t^{th}$ actual output of the entire filter;
$e_t = d_t - y_t$: represents the $t^{th}$ error committed by the entire filter; and
$w_{n,j}^m$: represents the $n^{th}$ weight of the $m^{th}$ subfilter during the $j^{th}$ processing block.

Using the above-identified scalars, the following vector quantities are defined:

$$X_t^m = [x_{t+\frac{N-1}{2}}^m,\, x_{t+\frac{N-1}{2}-1}^m,\, \ldots,\, x_t^m,\, \ldots,\, x_{t-\frac{N-1}{2}}^m], \quad (8)$$

where $X_t$ is the data vector in the $m^{th}$ nonblock acting subfilter at the time $y_t$, the output for the $t^{th}$ symbol, is computed. This vector has a length "N" equal to the length of the entire filter measured in symbols;

$$X_t^m = [x_{t+\frac{N-1}{2}}^m, x_{t+\frac{N-1}{2}+1}^m, \ldots, x_{t+\frac{N-1}{2}+L-1}^m], \quad (9)$$

where $X_t^m$ is the $j^{th}$ data block for the $m^{th}$ subfilter when (and only when) $t=jL$; i.e., a block of outputs $y_t$, $jL \leq t \leq (j+1)L-1$, is computed when the "M" block acting subfilters process the data blocks;

$$X_{jL}^m, 0 \leq m \leq M-1 \quad (10)$$

$$D_j = [d_{jL}, d_{jL+1}, \ldots, d_{(j+1)L-1}]' \quad (11)$$

where "$D_j$" is the $j^{th}$ block of desired outputs for the entire filter;

$$Y_j = [y_{jL}, y_{jL+1}, \ldots, y_{(j+1)L-1}]' \quad (12)$$

where "$Y_j$" is the $j^{th}$ block of actual outputs for the entire filter;

$$E_j = D_j - Y_j \quad (13)$$

where "$E_j$" is the $j^{th}$ error block; and $$W_j^m = [W_{0,j}^m, W_{1,j}^m, \ldots, W_{N-1,j}^m]' \quad (14)$$

where "$W_j^m$" is the $j^{th}$ weight vector for the $m^{th}$ subfilter.

A data matrix "$Z_j^m$" is also defined by its columns and rows as set forth in equations (15) and 16) below. The rows (16) are the data which the partitioned (but non-block) operating subfilter acts upon to calculate the outputs of the various symbols. The first column is the $j^{th}$ data block for the block operating subfilter.

$$Z_j^m = [X_{jL}^m, X_{jL-1}^m, \ldots, X_{jL-N+1}^m] \quad \text{(columns)} \quad (15)$$

$$= [X_{jL}^m, X_{jL+1}^m, \ldots, X_{(j+1)L-1}^m]' \quad \text{(rows)} \quad (16)$$

The following equation defines the "block mean squared error" (BMSE) and the intact filter output block:

$$BMSE = <E_j'E_j>/L \quad Y_j = \text{sum}_{m=0}^{M-1} Z_j^m W_j^m \quad (17)$$

As can be seen from equations (17), the BMSE is the average mean squared error throughout the processing block and the output of the entire filter is the sum of the outputs of the subfilters. Expanding the BMSE gives:

$$BMSE = (1/L)(<D_j'D_j> + <Y_j'Y_j> - 2<D_j'Y_j>) \quad (18)$$

$$= L^{-1}(<D_j'D_j> - 2\,\text{sum}_{m=0}^{M-1} <D_j'Z_j^m>W_j^m \quad (19)$$

$$+ \text{sum}_{a=0}^{M-1} \text{sum}_{b=0}^{M-1} W_j^{a'} <Z_j^{a'}Z_j^b> W_j^b$$

The gradient with respect to the $m^{th}$ weight vector is:

$$\text{grad}_{W_j^m} BMSE = -2L^{-1}(<Z_j^{m'}D_j> - \text{sum}_{a=0}^{M-1} <Z_j^{m'}Z_j^a>W_j^a) \quad (20)$$

The Griffiths stochastic gradient is obtained by dropping the ensemble average on all but the first term:

$$\text{grad}_{W_j^m} BMSE \approx -2L^{-1}(<Z_j^{m'}D_j> - \text{sum}_{a=0}^{M-1} Z_j^{m'}Z_j^a W_j^a) \quad (21)$$

$$= -2L^{-1}(<Z_j^{m'}D_j> - Z_j^{m'}Y_j) \quad (22)$$

The vector "$B^m$" $= <Z_j^{m'}D_j>$ is the partitioned, block righthand side vector because of its role in equation (22). If the components of this vector are denoted as $b_n^m$, $0 \leq n \leq N-1$, then:

$$B^m = [b_0^m, b_1^m, \ldots, b_{N-1}^m]' \quad (23)$$

The steepest descent iteration:

$$W_{j+1}^m = W_j^m - u\,\text{grad}_{W_j^m} BMSE \quad (24)$$

becomes the Griffiths algorithm when the true gradient is replaced with the Griffiths stochastic gradient:

$$W_{j+1}^m = W_j^m + 2u\,L^{-1}(B^m - Z_j^{m'}Y_j) \quad (25)$$

The components of the partitioned, block righthand side vectors are:

$$b_n^m = <X_{jL-n}^{m'}D_j> \quad (26)$$

$$= \text{sum}_{a=0}^{L-1} <x_{jL-n+(N-1)/2+a}^m\,d_{jL+a}> \quad (27)$$

$$= \text{sum}_{a=0}^{L-1} <x_{m+(jL-n+(N-1)/2+a)M} \cdot \quad (28)$$

$$\text{sum}_{c=0}^{M-1} k_c s_{(jL+a+1)M-1-c}>$$

The quantities $k_c$ of equation (28) are constant and the signal is presumed uncorrelated with the environment. Therefore:

$$b_n^m = \text{sum}_{a=0}^{L-1} \text{sum}_{c=0}^{M-1} k_c \cdot \quad (29)$$

$$<s_{m+(jL-n+(N-1)/2+a)M}s_{(jL+a+1)M-1-c}>$$

The expectations in equation (29) are independent of the indices "a" and "j" by assumption (c) above. Performing the sum over index "a" therefore gives $$b_n^m = L\,\text{sum}_{c=0}^{M-1} k_c <s_{m+((N-1)/2-n)M}s_{M-1-c}>, \quad (30)$$

$$0 \leq m \leq M-1, 0 \leq n \leq N-1$$

Equation (30) shows how the components may be calculated for various signals and kernel filters of interest. In cases where the expectations are not independent of the indices "a" and "j," equation (29) is used directly.

Figure 8:
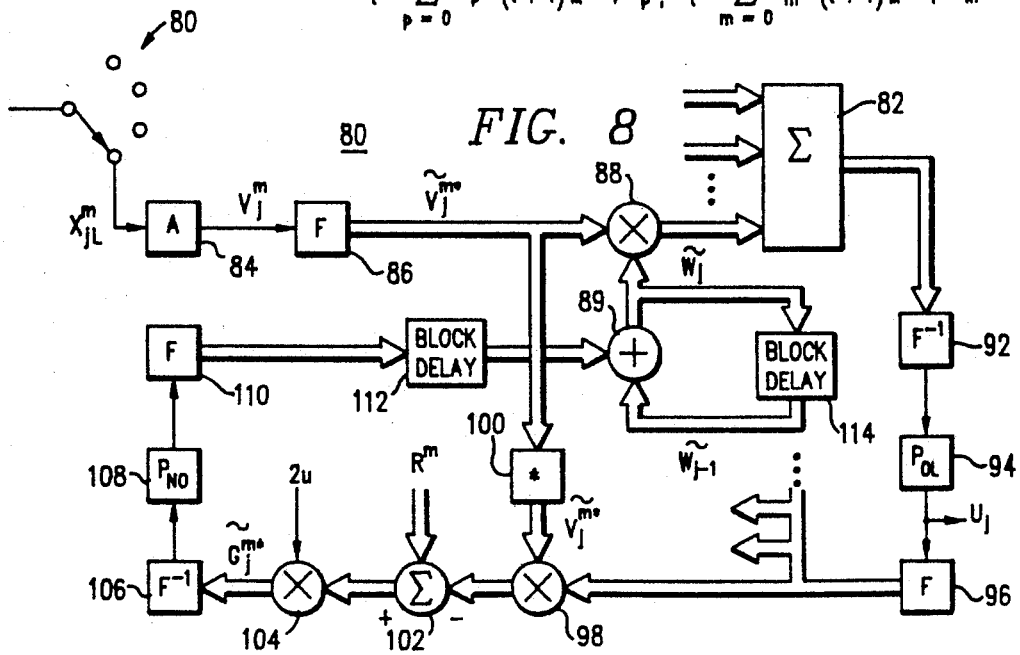
FIG. 8 is a schematic diagram of a frequency-domain version of the adaptive matched filter of the present invention.

The block Griffiths update:

$$W_{j+1}^m = W_j^m + 2u\,L^{-1}(B^m - Z_j^{m'}Y_j) \quad (31)$$

is then implemented to derive the frequency-domain filter 80 of the invention as shown in FIG. 8. It should be appreciated that the circuit in FIG. 8 represents merely one of the subfilters shown in FIG. 7, however, each of the subfilters has a similar structure. Before specifying the filter, the relationship between the length of a discrete Fourier transform (DFT) operator to be used in the filter, the length of the processing block (i.e. the number of valid symbol decisions produced by the demodulator in one cycle) and the length of the estimation filter (measured in symbols) must be defined:

$$(DFT\ length) = (\#decisions) + (filter\ length\ in\ symbols) - 1. \quad (32)$$

Defining:

$$N_{DFT} = DFT\ length \quad (33)$$

gives:

$$N_{DFT} = L + N - 1. \quad (34)$$

where N and L remain the lengths of the estimation filter and the processing block length, respectively, in units of symbols. The processing block data vectors $X_j{}^{Lm}$ have length L.

Referring now to FIG. 8, the processing block data vectors, for $0 \leq m \leq M-1$, are generated by the commutator 80. These vectors are then lengthened by appending, to their past (lower sample index) ends, the preceding $N-1$ samples produced at the appropriate $(m^{th})$ commutator tap, thus producing vectors of length $N_{DFT}$. Denoting the required operator 84 in FIG. 8 by "A" and the lengthened vectors as $V_j{}^m$:

$$V_j{}^m = AX_{jL}^m = [x_{jL-(N-1)/2}^m, x_{jL-(n-1)/2+1}^m, \cdots x_{jL+(N-1)/2-1}^m | X_{jL}^{m'}]'. \quad (35)$$

The data stream output (representing the lengthened block data vectors) from operator 82 is then applied to a discrete Fourier Transform (DFT) operator 86. Denoting the DFT matrix as "F" and the transformed vectors as $V_j{}^{\sim m}$:

$$V_j{}^{\sim m} = FV_j{}^m. \quad (36)$$

The components of these frequency-domain data vectors are next multiplied in operator 88 by the components of the current frequency-domain weight vectors $W_j{}^\sim$. The current frequency-domain weight vectors are generated by operator 89. The product vectors generated by operator 88 are added for each subfilter by summation operator 82. The outputs of operator 82 are then reverse transformed by inverse discrete Fourier Transform (DFT$^{-1}$) operator 92 and projection operator ($P_{OL}$) 94, which zeroes the first $N-1$ components of the output of the operator 92, to produce the time-domain vector $U_j$:

$$U_j = P_{OL} F^{-1} sum_{m=0}^{M-1} V_j{}^{\sim m} \otimes W_j{}^{\sim m} \quad (37)$$

where $\otimes$ denotes the vector product. The $j^{th}$ block of filter outputs $Y_j$ are the last L components of $U_j$:

$$U_j = [(N-1\ invalid\ components) | Y_j']'. \quad (38)$$

At this point the filter outputs have been produced but the weights must still be updated.

Vector $U_j$ is still of length $N_{DFT}$ and is forward transformed by DFT operator 96. The frequency-domain output of operator 96 is then multiplied by the conjugates of $V_j{}^{\sim m}$ in operator 98. The $V_j{}^{\sim m}$ conjugates are produced by operator 100. Using operator 102, the outputs from the multiplication operator 98 are subtracted from the frequency-domain righthand side vectors. The outputs of operator 102 are then multiplied by the adaptation rate constant in operator 104 to yield the frequency-domain subfilter gradient estimates $G_j{}^{\sim m}$.

Denoting the frequency-domain right hand side vectors as $R^m$:

$$G_j{}^{\sim m} = 2u\ [R^m - V_j{}^{\sim m*} \otimes FU_j] \quad (39)$$

Before the weights are updated, these gradient estimates are projected in the time domain by operator 106, all but their first "N" components are zeroed and then these estimates are returned to the frequency domain by operator 110. Denoting the projection operator 108 as $P_{NO}$:

$$W_{j+1}{}^{\sim m} = W_j{}^{\sim m} + FP_{NO} F^{-1} G_j{}^{\sim m} \quad (40)$$

The adaptive block filtering cycle is completed by delaying the outputs of operator 110 via delay block 112 and by applying the resultings delayed outputs to operator 89. As described above with respect to FIG. 3, the generated weight vector "$W_j$" is delayed by (block) delay 114 to form the second input to operator 89.

The frequency-domain righthand side vectors $R^m$ (which characterize the target signal) are specified as follows and are the transforms of the $B^m$, after zero-padding to the DFT length:

$$R^m = F\ [B^{m'} | (L-1\ zero\ components)\ ]'. \quad (41)$$

The N components of each of the $B^m$ are specified by equation (30) or, if conditions warrant, equation (29).

Although the invention has been described in detail, it should be appreciated that the same is by way of illustration and example only and is not meant to be limiting, the spirit and scope of the invention being limited only by the terms of the appended claims.

We claim:

1. An adaptive matched filter comprising means for synchronously sampling an input signal bearing bauded information and undefined noise, and a filter means for estimating on a symbol-by-symbol basis the signal-only output of a predetermined signal replica filter from a symbol-justified input data vector comprised of the synchronously sampled input signal.

2. The adaptive matched filter according to claim 1 wherein said filter means further comprises:
   means for weighting the input data vector signal with a weight vector when a symbol of interest is justified within the filter means; and
   means for iteratively adapting on a symbol-by-symbol basis the weight vector such that the weighted input data vector is a least means squared estimate of the signal-only output of a signal replica filter.

3. The adaptive matched filter according to claim 2 wherein said means for iteratively adapting the weight vector adapts the weight vector in substantial accordance with a "Griffiths" iteration process.

4. A method of filtering with an adaptive matched filter a bauded signal having one symbol per baud and an arbitrary noise component so as to estimate the signal only output of a signal replica filter, the method comprising the steps of:
   synchronously sampling an input signal at an integral multiple of the baud rate;
   weighting the input signal by weights; and
   adapting the weights so that the output is a least-mean squared estimation of the signal-only output signal replica filter.

5. The method of filtering according to claim 4 wherein said step of adapting the weight vector comprises iterating the weight vector so as to minimize the sum of the mean squared estimation errors for each symbol.

6. The method of filtering according to claim 5 wherein said step of adapting the weights further includes iterating the weights at the baud rate.

7. The method of filtering according to claim 6 wherein the step of adapting the weight vector takes place while the symbol is centered within the filter such that the samples of the input signal are cyclostationary during the adaptation of the weights.

8. The method of filtering according to claim 4 wherein the step of adapting the weighting vector comprises minimizing the sum of the mean squared estimation error over a block of symbols by adapting a weight array.

9. A frequency-domain adaptive matched filter comprising:
 means to weight an input signal having a bauded signal and noise components on a block-by-block basis, a block comprising a vector of symbols; and
 means to adapt the weighting of the input signal by iterating on a block-by-block basis so as to minimize the block mean squared error (BMSE) where the desired signal is the signal-only output of a signal replica filter.

10. The frequency-domain adaptive matched filter according to claim 9 wherein said means to weight an input signal further comprises a baud synchronous transversal filter divided into a number of subfilters equal to the number of samples per symbol, each subfilter having a length equal to the number of symbols per block.

11. The frequency-domain adaptive matched filter according to claim 9 wherein the BMSE estimate is minimized using the "Griffiths" stochastic gradient.

12. An adaptive matched filter for use in a maximum likelihood (ML) demodulator for improved performance in undefined noise environments, comprising:
 means for baud-synchronously sampling a signal bearing bauded information;
 filter means for estimating, when a symbol-of-interest is justified within the filter, a signal-only component of an output of a signal replica filter from a symbol-justified filter input comprised of the sampled signal.

13. The adaptive matched filter according to claim 12 wherein the filter means comprises:
 means for weighting the filter input; and
 means for iteratively adapting the means for weighting on a symbol-by-symbol basis.

14. The adaptive matched filter according to claim 13 wherein the means for iteratively adapting minimizes the least means squared difference between the weighted filter input and a signal-only component of an output of a predetermined signal replica filter in substantial accordance with a "Griffiths" iteration process.

15. The adaptive matched filter according to claim 14 wherein the filter means for weighting is comprised of means for generating a dot product from the input data vector and a weight vector.

16. The adaptive matched filter according to claim 15 wherein the signal-only component of the output of a signal replica filter is represented by the product of an ensemble average matrix of the signal component of the input signal and a coefficient vector of the signal replica filter.

17. The adaptive matched filter according to claim 16 wherein the means for iteratively adapting is comprised of:
 a first means for cross-multiplying the input data vector with the weighted input data vector:
 means for for generating a difference between the first cross-product the ensemble average matrix multiplied by the coefficient vector;
 second means for cross-multiplying the difference by a scaler quantity representing a rate of adaption of the iteration;
 means for delaying for a predeterimined period the second cross-product;
 means for summing the delayed second cross-product with a weight vector delayed for a predetermined time, where the sum is an adapted weight vector.

18. The adaptive matched filter according to claim 12 wherein the filter means comprises:
 means for weighting a filter input comprised of a block of symbols on a symbol block-by-symbol block basis; and
 means for iteratively adapting the means for weighting on a symbol block-by-symbol block basis.

19. The adaptive matched filter according to claim 18 wherein the means for iteratively adapting minimizes a sum of mean squared estimation errors between the weighted filter input and the signal only component of the output of a signal replica filter over a symbol block.

20. The adaptive matched filter according to claim 19 wherein the means for iteratively adapting iteratively adapts the means for weighting substantially in accordance with a block "Griffiths" update process utilizing a Griffiths stochastic gradient.

21. The adaptive matched filter according to claim 20 wherein the means for weighting comprises:
 a plurality of signal-synchronous subfilters; and
 means for summing the outputs of the subfilters.

22. The adaptive matched filter according to claim 21 wherein a signal-synchronous subfilter is comprised of a fast Fourrier transform operator coupled to the filter input.

23. A method of filtering bauded information signals having undefined noise components comprising:
 weighting an input signal bearing bauded information and noise, with an adaptive filter when the symbol of interest is justified within the adaptive filter; and
 adapting by iteration the weighting of the adaptive filter on a symbol-by-symbol basis such that the weighted input signal is an estimate of a signal-only component of an output of a signal replica filter.

24. The method of filtering according to claim 23 wherein the step of weighting the input signal is comprised of the steps of:
 synchronously sampling the input signal at a multiple integral of the baud rate; and
 weighting with the adaptive filter a symbol-justified input data vector comprised of the samples.

25. The method of filtering according to claim 24 wherein the step of weighting the input signal is comprised of the step of multiplying the input data vector with a weight vector, to produce a scalar filter output, the scalar filter output being the weighted input signal.

26. The method of filtering a bauded information signal according to claim 23 wherein the step of adapting by iteration the weighting is comprised of the step of adapting the weight vector according to a "Griffiths" iteration process to minimize the least mean squared error between the scaler filter output and a signal-only component of an output of a signal replica filter.

27. A method for filtering bauded information signals having undefined noise components comprising:
sampling baud-synchronously an input signal having bauded information and undefined noise at a multiple integral of the baud rate;
forming a filter input comprising a symbol-justified block of samples for a plurality of symbols;
weighting the filter input on a block-by-block basis with an adaptive filter when the symbol of interest is justified in the adaptive filter; and
adapting by iteration the weighting of the adaptive filter on a block-by-block basis such that the weighted input signal is an estimate of a signal-only component of an output of a predetermined signal replica filter.

28. The method of filtering bauded information signals according to claim 27 wherein the step of adapting by iteration minimizes the block mean squared error (BMSE) between the weighted filter input and the signal-only component of the output of the predetermined signal replica filter.

29. The method for filtering bauded information signals having undefined noise components according to claim 28 wherein the BMSE is minimized in substantial accordance with the "Griffith's" iteration process.

30. The method for filtering bauded information signals according to claim 27 wherein the step of generating a filter input is comprised of the step of commutating successive samples comprising a symbol to each of a plurality of signal-synchronous adaptive subfilters comprising the adaptive filter, the number of subfilters equaling the number of samples per symbol.

31. The method for filtering bauded information signals according to claim 30 wherein the step of weighting is comprised of the steps of:
weighting with the subfilter a data vector comprised of a predetermined number of commutated samples;
summing the weighted vectors from each subfilter to form a filter output.

32. The method for filtering bauded information signals having undefined noise components according to claim 31 wherein the step of weighting with the subfilter is comprised of the steps of:
transforming in each subfilter the data vector of commutated samples with a discrete Fourrier transform (DFT) operator; and
cross-multiplying the frequency domain data vector by a frequency domain weight vector.

* * * * *